United States Patent
Yu

(10) Patent No.: US 9,419,173 B2
(45) Date of Patent: Aug. 16, 2016

(54) FLIP-CHIP LED AND FABRICATION METHOD THEREOF

(71) Applicant: ENRAYTEK OPTOELECTRONICS CO., LTD., Shanghai (CN)

(72) Inventor: Hongbo Yu, Shanghai (CN)

(73) Assignee: ENRAYTEK OPTOELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/654,183

(22) PCT Filed: Mar. 1, 2013

(86) PCT No.: PCT/CN2013/072082
§ 371 (c)(1),
(2) Date: Jun. 19, 2015

(87) PCT Pub. No.: WO2014/117419
PCT Pub. Date: Aug. 7, 2014

(65) Prior Publication Data
US 2015/0349195 A1    Dec. 3, 2015

(30) Foreign Application Priority Data

Feb. 1, 2013 (CN) .......................... 2013 1 0041872

(51) Int. Cl.
| | |
|---|---|
| *H01L 33/00* | (2010.01) |
| *H01L 33/38* | (2010.01) |
| *H01L 33/60* | (2010.01) |
| *H01L 33/06* | (2010.01) |
| *H01L 33/40* | (2010.01) |
| *H01L 33/20* | (2010.01) |

(52) U.S. Cl.
CPC .............. *H01L 33/007* (2013.01); *H01L 33/06* (2013.01); *H01L 33/382* (2013.01); *H01L 33/40* (2013.01); *H01L 33/60* (2013.01); *H01L 33/0079* (2013.01); *H01L 33/0095* (2013.01); *H01L 33/20* (2013.01); *H01L 33/405* (2013.01); *H01L2933/0016* (2013.01); *H01L 2933/0058* (2013.01)

(58) Field of Classification Search
CPC ....... H01L 33/22; H01L 33/38; H01L 33/382; H01L 33/385; H01L 33/387; H01L 33/007; H01L 33/06; H01L 33/40; H01L 33/60
See application file for complete search history.

(56) References Cited

U.S. PATENT DOCUMENTS

| | | | |
|---|---|---|---|
| 8,680,561 B2 * | 3/2014 | Kitagawa ............... | B82Y 20/00 257/103 |
| 2006/0273336 A1 | 12/2006 | Fujikura et al. | |
| 2008/0054290 A1 | 3/2008 | Shieh et al. | |

FOREIGN PATENT DOCUMENTS

| | | |
|---|---|---|
| CN | 1645634 A | 7/2005 |
| CN | 1661818 A | 8/2005 |

(Continued)

*Primary Examiner* — Jose R Diaz
(74) *Attorney, Agent, or Firm* — Muncy, Geissler, Olds & Lowe, P.C.

(57) ABSTRACT

A flip-chip LED and a method for forming the LED are disclosed. The method includes: providing a substrate and depositing on the substrate an epitaxial layer including, from the bottom upward, an n-type GaN layer, a multi-quantum well active layer, and a p-type GaN layer; etching the epitaxial layer to form an array of openings exposing the n-type GaN layer; forming a first metal layer on the p-type GaN layer; annealing the first metal layer to induce self-assembly thereof; etching the p-type GaN layer by using the first metal layer as a mask such that an array of holes formed therein; and depositing a second metal layer over the array of holes, the second metal layer and the first metal layer form a metal reflector layer. The design can result in an improvement in the light extraction efficiency of the LED.

10 Claims, 3 Drawing Sheets

(56) References Cited

FOREIGN PATENT DOCUMENTS

| CN | 1877874 A | 12/2006 |
| CN | 1883058 A | 12/2006 |
| CN | 101159307 A | 4/2008 |
| CN | 201060874 Y | 5/2008 |
| CN | 101859861 A | 10/2010 |
| CN | 201773864 U | 3/2011 |
| CN | 102104233 A | 6/2011 |

* cited by examiner

FLIP-CHIP LED AND FABRICATION METHOD THEREOF

TECHNICAL FIELD

The present invention relates to the fabrication of light-emitting diodes (LEDs) and, more particularly, to a flip-chip LED and a fabrication method thereof.

BACKGROUND

In the fabrication of a conventional LED, there is a difficulty in p-type doping of gallium nitride (GaN) material, which leads to a low concentration of hole carriers and limitations to the thickness of the material and thus forms a barrier for current diffusion. In order to obtain uniform current distribution, a current spreading layer is typically formed over the p-type GaN material.

However, use of the current spreading layer is also associated with some issues. On the one hand, the current spreading layer partially absorbs light and causes a reduction in light extraction efficiency. On the other hand, thinning the current spreading layer will make it less effective to form uniform and reliable current spread over the p-type GaN material. Therefore, its use requires a proper compromise between the light extraction efficiency and the current spread effect. This will inevitably impose limitations on further improvement of its power conversion efficiency. In addition, in the conventional LED, as electrodes and leads are arranged on the same side of a light-generating region, light is partially blocked away during operation and the efficiency of the conventional LED is thus limited. Further, the conventional LED relies on a sapphire substrate with a very low thermal conductivity for dissipation of heat from its p-n junction. This will lead to a very long heat conduction path in case of a power LED device having a large size. As a result, the conventional LED will have high thermal impedance, as well as a limited operating current.

In order to overcome the above-described drawbacks of the conventional LED, Lumileds invented a flip-chip LED in 1998. The flip-chip LED is fabricated by: preparing an LED die; preparing a submount sized correspondingly to the die and forming, on the submount, a conductive layer and conductive structures (gold solder balls for ultrasonic bonding) for connection of electrodes; and welding together the LED die and the submount. This structure additionally incorporates a metal reflector layer between its p-n junction and p-electrode, which directs light to exit from the sapphire substrate while not being blocked by the electrodes and leads. In addition, since light does not transmit through the current spreading layer, the current spreading layer is allowed to be made thicker so as to achieve a more uniform distribution of current density in the flip-chip LED. Further, this structure allows the conductive layer or metal solder balls to directly conduct heat from the p-n junction to the submount with a terminal conductivity that is 3-5 times higher than the conductivity of the sapphire substrate, thus resulting in a better heat-sinking effect. Therefore, this structure is more advantageous in terms of electrical, optical and thermal performance.

An existing method for forming the metal reflector layer is to electroplate a highly reflective metal onto the surface of the p-type GaN material. As a result, since light generated from the active layer is reflected at the bottom of the flip-chip LED, light is less absorbed at the bottom of the LED and the LED's light extraction efficiency can thus be improved. However, this architecture makes part of the light confined in a wave guiding structure formed by the layers of the LED. After several reflections therein, the part of the light will be attenuated or absorbed rather than escaping. This is detrimental to the light extraction efficiency.

SUMMARY OF THE INVENTION

It is an aim of the present invention to provide a method that can improve the light extraction efficiency of a flip-chip LED.

In pursuit of this aim, in one aspect, the present invention resides in a method of fabricating a flip-chip LED, including:

providing a substrate and depositing an epitaxial layer on the substrate, the epitaxial layer including, successively from the bottom upward, an n-type gallium nitride layer, a multi-quantum well active layer, and a p-type gallium nitride layer;

etching the epitaxial layer to form an array of openings exposing the underlying n-type gallium nitride layer;

forming a first metal layer on the p-type gallium nitride layer;

annealing the first metal layer to induce self-assembly thereof;

etching the p-type gallium nitride layer by using the first metal layer as a mask, such that an array of holes are formed in the p-type gallium nitride layer; and depositing a second metal layer over the array of holes, the second metal layer and the first metal layer forming a metal reflector layer.

Optionally, the metal reflector layer may be formed of a multi-layer metal stack.

Optionally, the multi-layer metal stack may be a Ni/Ag/Ti/Pt/Au metal stack, a Ni/Al/Ti/Pt/Au metal stack, a Ni/Ag/Ni/Au metal stack, or a Ni/Al/Ti/Au metal stack.

Optionally, the metal reflector layer may have a thickness of 0.1 nm~10 nm.

Optionally, the array of holes may be formed in the p-type GaN layer by dry-etching the p-type GaN layer.

Optionally, the method may further include: forming an n-electrode on the n-type GaN layer and a p-electrode on the metal reflector layer; and welding the n-electrode and the p-electrode onto a submount in a flip-chip configuration, after forming the metal reflector layer.

Optionally, the electrodes may be both formed of gold, an Au/Sn film or a Sn solder paste.

Optionally, the substrate may be a sapphire substrate.

In a second aspect, the present invention resides in a flip-chip LED formed by the method as defined above, including: a substrate; an epitaxial layer on the substrate, the epitaxial layer including, successively from the bottom upward, an n-type GaN layer, a multi-quantum well active layer, and a p-type GaN layer, the p-type GaN layer including an array of holes formed therein; and a metal reflector layer on the p-type GaN layer.

Optionally, the metal reflector layer may be formed of a multi-layer metal stack.

Optionally, the multi-layer metal stack may be a Ni/Ag/Ti/Pt/Au metal stack, a Ni/Al/Ti/Pt/Au metal stack, a Ni/Ag/Ni/Au metal stack, or a Ni/Al/Ti/Au metal stack.

Optionally, the metal reflector layer may have a thickness of 0.1 nm~10 nm.

Optionally, the LED may further include: a p-electrode on the metal reflector layer and an n-electrode on the n-type GaN layer; and a submount in connection both to the p-electrode and to the n-electrode.

Optionally, the electrodes may be both formed of gold, an Au/Sn film or a Sn solder paste.

As described above, in the method according to the present invention, a first metal layer is formed on a p-type GaN layer and annealed for self-assembly and then serves as a mask in an etching process carried out on the p-type GaN layer. Afterward, a second metal layer is deposited, which, together with the first metal layer, forms an uneven metal reflector layer. At this layer, light emitted from the active layer is scattered and finally exits rather than being confined in a wave guiding structure formed by the layers of the LED. This results in an improvement in the light extraction efficiency of the LED.

DETAILED DESCRIPTION OF THE EXEMPLARY EMBODIMENTS

As has been mentioned in the Background section, the existing metal reflector layer still has impact on the light extraction efficiency of the flip-chip LED. The present invention provides a flip-chip LED and a fabrication method thereof. In the fabrication method of the flip-chip LED, a first metal layer is formed and annealed for self-assembly and then a p-type GaN layer is etched by using the first metal layer as a mask. Afterward, a second metal layer is deposited, which, together with the first metal layer, forms an uneven metal reflector layer which results in an improved light extraction efficiency of the flip-chip LED.

The present invention will be described in greater detail in the following description demonstrating preferred embodiments of the invention, which are to be read in conjunction with the accompanying drawings. Those of skill in the art should, in light of the present disclosure, appreciate that many changes can be made in the specific embodiments disclosed herein and still obtain the same beneficial results. Therefore, the following description should be construed as illustrative of the principles of the present invention, and not providing limitations thereto.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time consuming but would nevertheless be a routine undertaking for those of ordinary skill in the art.

This invention will be further described in the following paragraphs by way of example with reference to the accompanying drawings. Features and advantages of the invention will be apparent from the following detailed description, and from the appended claims. Note that the accompanying drawings are provided in a very simplified form not necessarily presented to scale, with the only intention of facilitating convenience and clarity in explaining a few exemplary embodiments of the invention.

Figure 1:
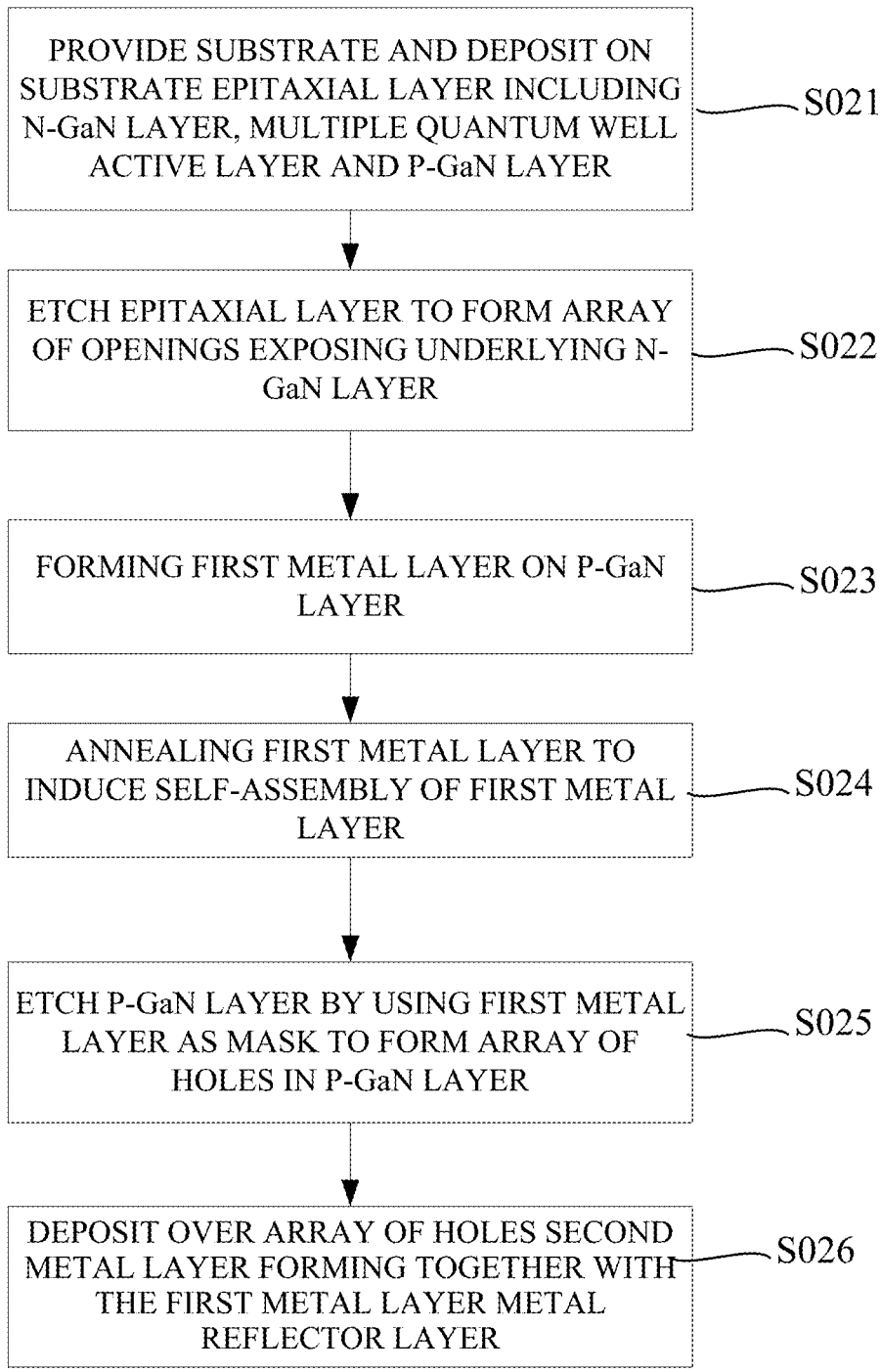
FIG. 1 is a flow chart illustrating a method of forming a flip-chip LED in accordance with an embodiment of the present invention.

FIG. 1 is a flow chart showing a method of forming a flip-chip LED in accordance with an embodiment of the present invention. The method includes the steps of:

step S021: providing a substrate and depositing on the substrate an epitaxial layer including an n-type GaN layer, a multi-quantum well active layer, and a p-type GaN layer;

step S022: etching the epitaxial layer to form an array of openings exposing the underlying n-type GaN layer;

step S023: forming a first metal layer on the p-type GaN layer;

step S024: annealing the first metal layer to induce self-assembly of the first metal layer;

step S025: etching the p-type GaN layer by using the first metal layer as a mask, such that an array of holes are formed in the p-type GaN layer; and step S026: depositing a second metal layer covering the array of holes, the second metal layer and the first metal layer form a metal reflector layer.

A core concept of the method is first forming on a p-type GaN layer a first metal layer that is then annealed for self-assembly and etching the p-type GaN layer by using the self-assembled first metal layer as a mask and finally forming an uneven metal reflector layer which allows scattering thereat and exiting of light generated by the active layer such as to prevent the light from being confined in a wave guiding structure formed by the layers of the LED, and thereby results in an improvement in the LED's light extraction efficiency.

Figure 2A:
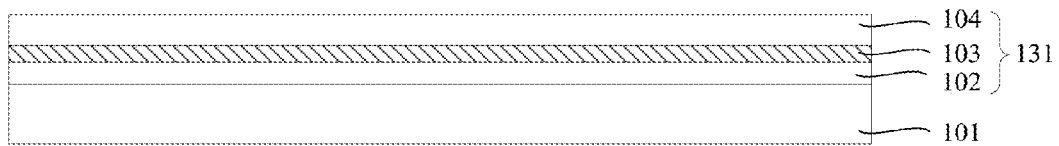
FIGS. 2A to 2G are schematics illustrating the steps of a method of forming a flip-chip LED in accordance with an embodiment of the present invention.

Referring to FIG. 2A, in step S021, a substrate 101 is provide and an epitaxial layer 131 is deposited on the substrate 101. In this embodiment, the substrate 101 is a sapphire substrate that preferably has a patterned surface. The epitaxial layer 131 includes, successively from the bottom upward, an n-type GaN layer 102, a multi-quantum well active layer 103, and a p-type GaN layer 104.

Figure 2B:
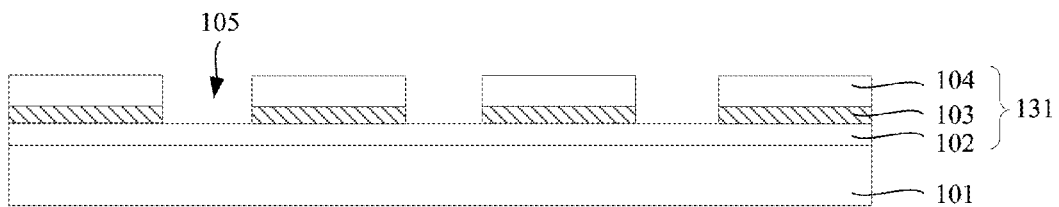

Referring to FIG. 2B, in step S022, the epitaxial layer 131 is etched such that an array of openings 105 are formed therein, where the array of openings 105 expose the underlying n-type GaN layer 102.

Figure 2C:
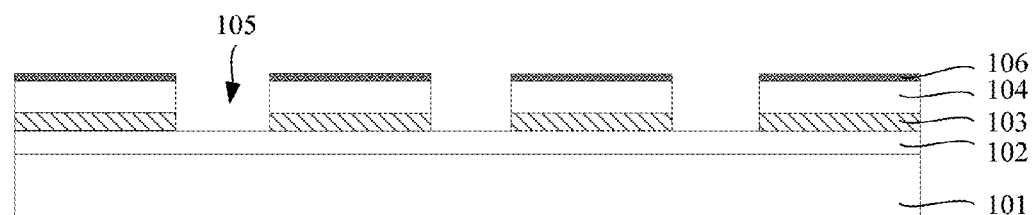

Referring to FIG. 2C, in step S023, a first metal layer 106 is formed on the p-type GaN layer 104. Preferably, the first metal layer 106 is a multi-layer metal stack such as, for example, a Ni/Ag/Ti/Pt/Au, Ni/Al/Ti/Pt/Au, Ni/Ag/Ni/Au or Ni/Al/Ti/Au metal stack, that functions at the same time as a reflector, a current spreader and a heat sink. The first metal layer 106 has a thickness of 0.1 nm~10 nm and may be formed both in the array of openings 105 and on the p-type GaN layer 104 by electroplating, deposition or other method. Afterward, portions of the first metal layer 106 in the array of openings 105 are selectively removed, for example, by: applying photoresist over the first metal layer 106, photolithographically exposing portions of the first metal layer in the array of openings 105, and etching away portions of the first metal layer overlying the n-type GaN layer 102.

Figure 2D:
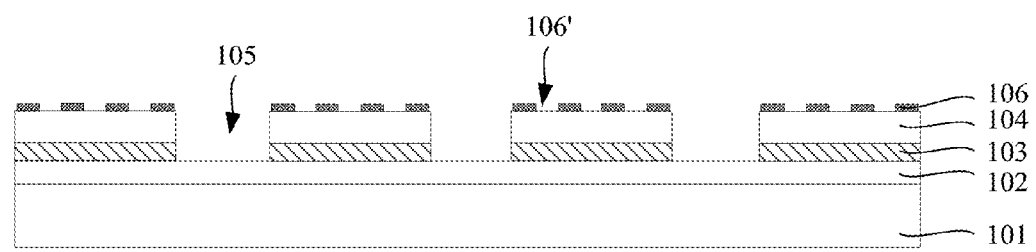

Referring to FIG. 2D, in step S024, the first metal layer 106 is annealed to induce self-assembly of the first metal layer 106. During the annealing process, the first metal layer 106 is crystallized and Ostwald ripening occurs therein so that small crystals disappear and large crystals grow. As a result, the first metal layer 106 self-assembles into a discontinuous metal layer including an array of pores 106' that partially expose the underlying p-type GaN layer 104. The annealing process may be performed at a temperature ranging from 200° C. to 900° C., which is adaptable for the material forming the first metal layer 106.

Figure 2E:
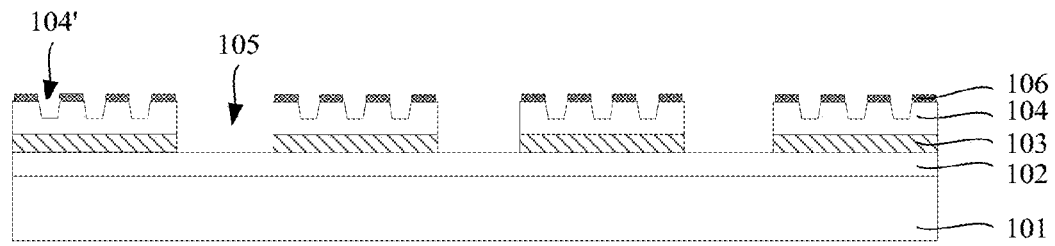

Referring to FIG. 2E, in step S025, the p-type GaN layer 104 is etched by using the first metal layer 106 as a mask, such that an array of holes 104' are formed in the p-type GaN layer 104. Preferably, the p-type GaN layer 104 is etched by a dry etching process in which the underlying multi-quantum well active layer 103 is not exposed.

Figure 2F:
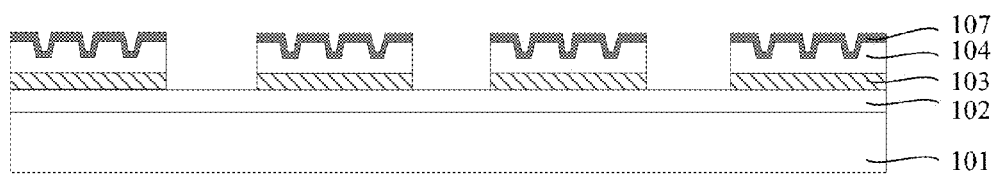

Referring to FIG. 2F, in step S026, over the array of holes is deposited a second metal layer which is a multi-layer metal stack such as, for example, a Ni/Ag/Ti/Pt/Au, Ni/Al/Ti/Pt/Au, Ni/Ag/Ni/Au or Ni/Al/Ti/Au metal stack. The first and second metal layer jointly form a metal reflector layer 107, so that the metal reflector layer is also a multi-layer metal functioning at the same time as a reflector, a current spreader and a heat sink. As such, after being scattered at the uneven metal reflector layer, light generated by the multi-quantum well active layer will exit from the substrate without being confined within a wave guiding structure formed by the layers of the LED. This results in an improvement in the light extraction efficiency of the LED.

It is of course that the method can further include steps commonly involved in the fabrication of a flip-chip LED, subsequent to the formation of the metal reflector layer 107. For example, referring to FIG. 2G, the method can further including: forming an n-electrode 108 on the n-type GaN layer 102 and a p-electrode 109 on the metal reflector layer 107 after the structure shown in FIG. 2F is flipped over; welding the n-electrode 108 and the p-electrode 109 onto a submount 110 in a flip-chip configuration; and separating the substrate into dies and packaging the dies. These steps may be added to the present invention by those skilled in the art based on the common general knowledge.

Figure 2G:
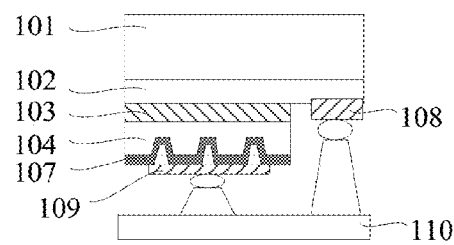

According to another aspect of the invention, a flip-chip LED formed by the method in accordance with the foregoing embodiment is further provided, including, as shown in FIG. 2G: a substrate 101; an epitaxial layer on the substrate 101; and a metal reflector layer 107 on a p-type GaN layer 104. The epitaxial layer includes an n-type GaN layer 102, a multi-quantum well active layer 103, and a p-type GaN layer 104. The p-type GaN layer 104 includes an array of holes formed therein. The metal reflector layer 107 is an uneven layer, which allows light generated by the multi-quantum well active layer to be scattered thereat and exit from a wave guiding structure formed by the layers of the LED after several reflections rather than being confined in the structure, thereby resulting in an improvement in the LED's light extraction efficiency.

In summary, the present invention provides a flip-chip LED and a corresponding fabrication method in which a first metal layer is formed on a p-type GaN layer and annealed for self-assembly. The first metal layer then serves as a mask in an etching process carried out on the p-type GaN layer. At last, an uneven metal reflector layer is formed, at which light from a multi-quantum well active layer is scattered and finally exits rather than being confined in a wave guiding structure formed by the layers of the LED, thus resulting in an improvement in the LED's light extraction efficiency.

Obviously, those skilled in the art may make various modifications and alterations without departing from the spirit and scope of the invention. It is therefore in-tended that the invention be construed as including all such modifications and alterations insofar as they fall within the scope of the appended claims or equivalents thereof.

What is claimed is:

1. A method of forming a flip-chip light-emitting diode (LED), comprising the following steps performed sequentially:
   providing a substrate and depositing an epitaxial layer on the substrate, the epitaxial layer comprising, successively from the bottom upward, an n-type gallium nitride layer, a multi-quantum well active layer, and a p-type gallium nitride layer;
   etching the epitaxial layer to form an array of openings exposing the underlying n-type gallium nitride layer;
   forming a first metal layer on the p-type gallium nitride layer;
   annealing the first metal layer to induce self-assembly thereof;
   etching the p-type gallium nitride layer by using the first metal layer as a mask, such that an array of holes are formed in the p-type gallium nitride layer; and
   depositing a second metal layer over the array of holes, the second metal layer and the first metal layer forming a metal reflector layer.

2. The method of claim 1, wherein at least one of the first and second metal layers is formed of a multi-layer metal stack.

3. The method of claim 2, wherein the multi-layer metal stack is a Ni/Ag/Ti/Pt/Au metal stack, a Ni/Al/Ti/Pt/Au metal stack, a Ni/Ag/Ni/Au metal stack, or a Ni/Al/Ti/Au metal stack.

4. The method of claim 3, wherein the metal reflector layer has a thickness of 0.1 nm-10 nm.

5. The method of claim 1, wherein the array of holes is formed in the p-type gallium nitride layer by dry-etching the p-type gallium nitride layer.

6. The method of claim 1, wherein the substrate is a sapphire substrate.

7. A flip-chip light-emitting diode (LED) formed by the method as defined in claim 1, comprising:
   a substrate;
   an epitaxial layer on the substrate, the epitaxial layer comprising, successively from the bottom upward, an n-type gallium nitride layer, a multi-quantum well active layer, and a p-type gallium nitride layer, the p-type gallium nitride layer comprising an array of holes formed therein; and
   a metal reflector layer on the p-type gallium nitride layer.

8. The flip-chip LED of claim 7, wherein the metal reflector layer is formed of a multi-layer metal stack.

9. The flip-chip LED of claim 8, wherein the multi-layer metal stack is a Ni/Ag/Ti/Pt/Au metal stack, a Ni/Al/Ti/Pt/Au metal stack, a Ni/Ag/Ni/Au metal stack, or a Ni/Al/Ti/Au metal stack.

10. The flip-chip LED of claim 8, wherein the metal reflector layer has a thickness of 0.1 nm-10 nm.

* * * * *